United States Patent
Pai

(10) Patent No.: US 6,972,492 B2
(45) Date of Patent: Dec. 6, 2005

(54) METHOD AND STRUCTURE TO FORM CAPACITOR IN COPPER DAMASCENE PROCESS FOR INTEGRATED CIRCUIT DEVICES

(75) Inventor: Chi Hong Pai, Shanghai (CN)

(73) Assignee: Semiconductor Manufacturing International (Shanghai) Corporation, Shanghai (CH)

(*) Notice: Subject to any disclaimer, the term of this patent is extended or adjusted under 35 U.S.C. 154(b) by 0 days.

(21) Appl. No.: 10/773,592

(22) Filed: Feb. 6, 2004

(65) Prior Publication Data

US 2005/0146043 A1 Jul. 7, 2005

(30) Foreign Application Priority Data

Dec. 30, 2003 (CN) .......................... 2003101229594

(51) Int. Cl.⁷ ............................................. H01L 29/40
(52) U.S. Cl. ...................... 257/762; 257/774; 257/758; 257/752; 257/750; 438/622; 438/624; 438/626; 438/627
(58) Field of Search ................................ 257/762, 750, 257/758, 751, 752, 774; 438/622, 624, 626, 438/627

(56) References Cited

U.S. PATENT DOCUMENTS

| | | | | |
|---|---|---|---|---|
| 6,313,028 B2 * | 11/2001 | Huang et al. | ................ | 438/637 |
| 6,344,413 B1 * | 2/2002 | Zurcher et al. | ............. | 438/678 |
| 6,436,787 B1 * | 8/2002 | Shih et al. | ................... | 438/396 |
| 6,451,688 B1 * | 9/2002 | Shimpuku | .................... | 438/624 |
| 6,524,962 B2 * | 2/2003 | Chen et al. | .................. | 438/694 |
| 6,693,360 B1 * | 2/2004 | Dei et al. | ................... | 438/632 |
| 2002/0102834 A1 * | 8/2002 | Yang | .......................... | 438/618 |

FOREIGN PATENT DOCUMENTS

JP     2000-208745     * 7/2000     ......... H01L 27/108

OTHER PUBLICATIONS

Current Technical Trends: Dual Damascene & Low-K Dielectrics, pp. 1-6, Jerry Healey, 2002.*

* cited by examiner

Primary Examiner—Jasmine Clark
(74) Attorney, Agent, or Firm—Townsend and Townsend and Crew LLP

(57) ABSTRACT

A method and resulting structure of forming a metal on metal capacitor structure for an integrated circuit device, e.g., mixed signal. The method includes forming a dual damascene structure, where the structure has a first conductive portion comprising copper material that is separated by a dielectric material from a second conductive portion. The second conductive portion is coupled to the first conductive portion underlying the dielectric material through a third conductive portion. The first conductive portion, the dielectric material, and the second conductive portion form a substantially planar surface region opposing the third conductive portion. The first conductive portion and the second conductive portion is coupled through the third conductive portion define a first electrode. The method selectively removing the dielectric material between the first conductive portion and the second conductive portion to form an opening defined by the first conductive portion and the second conductive portion. The method forms an insulting layer within with opening to define a capacitor dielectric layer therefrom. The method also forms a copper layer overlying the insulating layer to a height above the substantially planar surface to form a second electrode. The method also planarizes the copper layer to define the second electrode.

17 Claims, 2 Drawing Sheets

METHOD AND STRUCTURE TO FORM CAPACITOR IN COPPER DAMASCENE PROCESS FOR INTEGRATED CIRCUIT DEVICES

CROSS-REFERENCES TO RELATED APPLICATIONS

NOT APPLICABLE

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK.

NOT APPLICABLE

BACKGROUND OF THE INVENTION

The present invention is directed to integrated circuits and their processing for the manufacture of semiconductor devices. More particularly, the invention provides a method and structure for a metal insulating metal ("MIM") capacitor using a dual damascene copper process in the fabrication of semiconductor devices. For example, the invention can be applied to a variety of devices such as mixed signal, analog, signal processors, microprocessors, and others. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is the ability to integrated certain devices into conventional process flows in an efficient and accurate manner.

As merely an example, capacitor structures have been integrated into a variety of process flows. Such capacitor structures often require a first capacitor plate coupled to a second capacitor via capacitor dielectric layer. A voltage differential is applied between these plates to allow charge to build up therebetween. These capacitor structures often require high capacitance but should be formed in a compact and efficient manner. Unfortunately, it is often difficult to make capacitors small and compact without impacting the amount of capacitance provided by the capacitor structure. These and other limitations have been described throughout the present specification and more particularly below.

From the above, it is seen that an improved technique for processing semiconductor devices is desired.

BRIEF SUMMARY OF THE INVENTION

According to the present invention, techniques including methods and resulting device structures for the manufacture of semiconductor devices are provided. More particularly, the invention provides a method and structure for a metal insulating metal ("MIM") capacitor using a dual damascene copper process in the fabrication of semiconductor devices. For example, the invention can be applied to a variety of devices such as mixed signal, analog, signal processors, microprocessors, and others. But it would be recognized that the invention has a much broader range of applicability.

In a specific embodiment, the invention provides a method of forming a metal on metal capacitor structure for an integrated circuit device, e.g., mixed signal. The method includes forming a dual damascene structure, where the structure has a first conductive portion comprising copper material that is separated by a dielectric material from a second conductive portion. The second conductive portion is coupled to the first conductive portion underlying the dielectric material through a third conductive portion. The first conductive portion, the dielectric material, and the second conductive portion form a substantially planar surface region opposing the third conductive portion. The first conductive portion and the second conductive portion is coupled through the third conductive portion define a first electrode. The method selectively removing the dielectric material between the first conductive portion and the second conductive portion to form an opening defined by the first conductive portion and the second conductive portion. The method forms an insulting layer within with opening to define a capacitor dielectric layer therefrom. The method also forms a copper layer overlying the insulating layer to a height above the substantially planar surface to form a second electrode. The method also planarizes the copper layer to define the second electrode.

In an alternative specific embodiment, the invention provides integrated circuit device including capacitor structures, e.g., MIM. The device has a semiconductor substrate and a dual damascene structure formed overlying the semiconductor substrate. The dual damascene structure has a first conductive portion comprising copper material and a second conductive portion comprising a copper material coupled to the first conductive portion. A region (e.g., gap or spacing) is defined between the first conductive portion and the second conductive portion. A third conductive portion couples (e.g., electrically connects) the second conductive portion with the first conductive portion. The third conductive portion is provided underlying the region. Here, the term "underlying" is merely used to for descriptive purposes and has no relationship to the direction of gravity. The dual damascene structure also has a substantially planar surface region formed opposing the third conductive portion. The substantially planar surface region comprises a portion of the first conductive portion and a portion of the second conductive portion. A first capacitor electrode is formed from at least the first conductive portion, the second conductive portion, and the third conductive portion. The device has an opening formed in a portion of the region between the first conductive portion and the second conductive portion. A capacitor insulting layer is formed within the opening in the region. A planarized copper layer is overlying the insulating layer. The planarized copper layer includes a surface region at a height at about the substantially planar surface region. A second electrode is formed from a portion of the planarized copper layer.

Many benefits are achieved by way of the present invention over conventional techniques. For example, the present technique provides an easy to use process that relies upon conventional technology. In some embodiments, the invention uses only a single masking layer to form an MIM capacitor structure. Additionally, the invention provides a three-dimensional structure for increased capacitance. Preferably, the invention can be applied to a variety of applications such as mixed signal, and other devices. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques including methods for the manufacture of semiconductor devices are provided. More particularly, the invention provides a method and structure for a metal insulating metal ("MIM") capacitor using a dual damascene copper process in the fabrication of semiconductor devices. For example, the invention can be applied to a variety of devices such as mixed signal, analog, signal processors, microprocessors, and others. But it would be recognized that the invention has a much broader range of applicability.

Figure 1A:
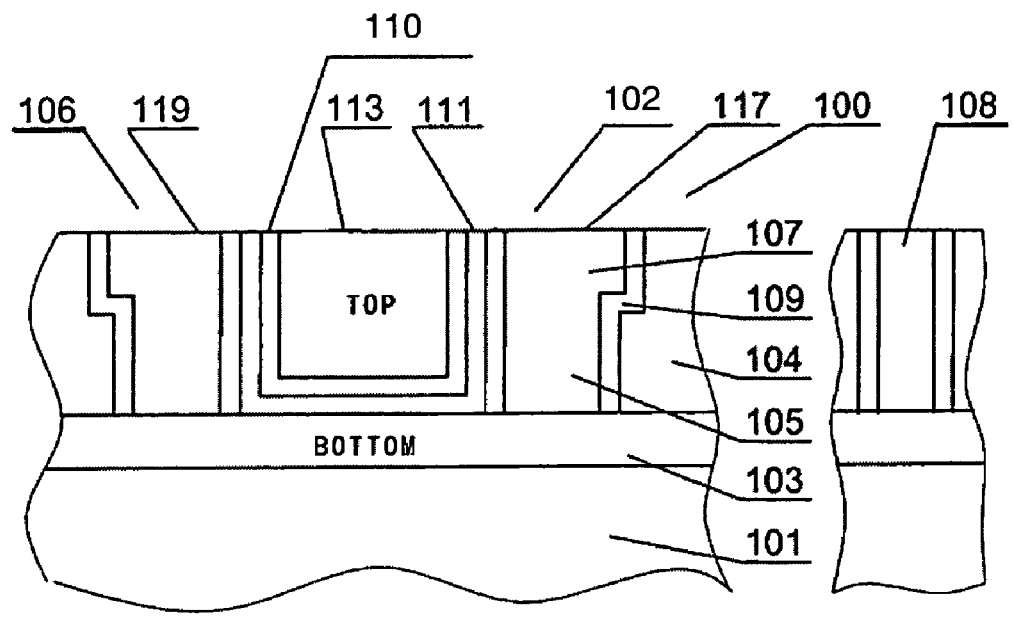
FIG. 1 is a simplified cross-sectional view of a completed capacitor structure for an integrated circuit device according to an embodiment of the present invention.
Figure 1B:
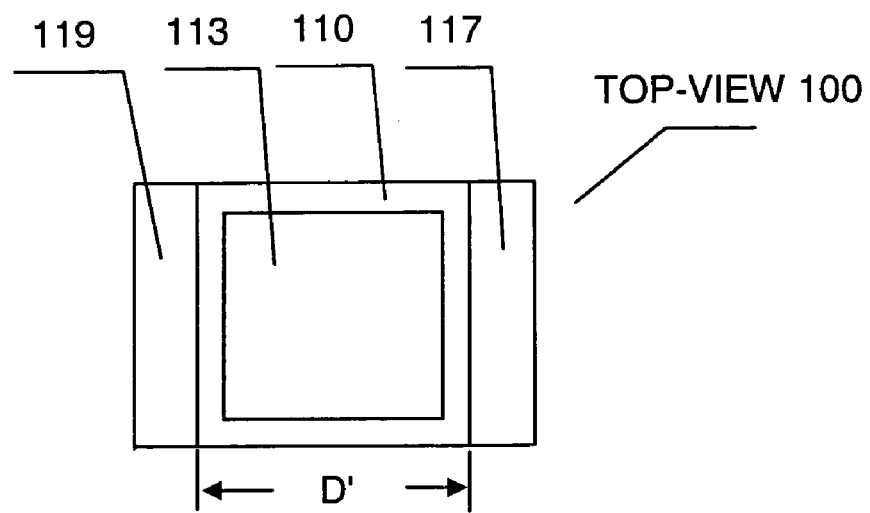
Figure 2:
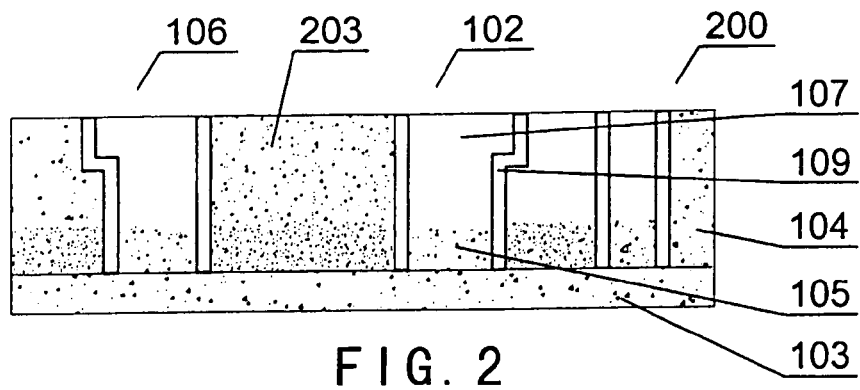
FIGS. 2–5 are simplified diagrams illustrating methods of forming a capacitor structure according to embodiments of the present invention

FIG. 1 is a simplified cross-sectional view of a completed capacitor structure 100 for an integrated circuit device according to an embodiment of the present invention. This diagram is merely an example, which should not unduly limit the scope of the claims herein. One of ordinary skill in the art would recognize many other variations, modifications, and alternatives. As shown, the device has a semiconductor substrate 101, e.g., silicon wafer, silicon on insulator, epitaxial silicon wafer. The device has dual damascene structure formed overlying the semiconductor substrate. The dual damascene structure has a first conductive portion 102 comprising copper material and a second conductive portion 106 comprising a copper material. The first conductive portion has a plug region 105 and an overlying layer region 107 provided within dielectric material 104. The portion is provided within barrier layer 109, which lines dielectric material 104. The second conductive portion is coupled to the first conductive portion. A region (e.g., gap or spacing) 110 is defined between the first conductive portion and the second conductive portion. A third conductive portion couples (e.g., electrically connects) 103 the second conductive portion with the first conductive portion. The third conductive portion is provided underlying the region as shown. Here, the term "underlying" is merely used to for descriptive purposes and has no relationship to the direction of gravity. The dual damascene structure also has a substantially planar surface region formed opposing the third conductive portion. The substantially planar surface region comprises a portion 117 of the first conductive portion and a portion 119 of the second conductive portion. A first capacitor electrode is formed from at least the first conductive portion, the second conductive portion, and the third conductive portion.

The device has an opening, which is filled with conductive material, formed in a portion of the region between the first conductive portion and the second conductive portion. A capacitor insulting layer 111 (e.g., oxide, silicon dioxide, silicon nitride, or any combination of these) is formed within the opening in the region. The opening is provided between the damascene structures as illustrated by the top-view diagram, also shown in FIG. 1. The opening has a dimension (i.e., D') of about 100 microns or greater in certain embodiments. Other dimensions can also exist depending upon the embodiment.

A planarized copper layer 113 is overlying the insulating layer. The planarized copper layer includes a surface region at a height at about the substantially planar surface region and/or a height above or slightly below depending upon the specific embodiment. The planarized copper layer can be formed by deposition/plating and planarization techniques, which will be described in more detail below. As shown, a second electrode is formed from a portion of the planarized copper layer to define the capacitor structure. An interconnect structure 108 is also shown in FIG. 1. Certain features of the present structure can be found in specifically below.

Preferably, the dual damascene structure has a first conductive portion comprising copper material and a second conductive portion comprising a copper material coupled to the first conductive portion. A region (e.g., gap or spacing) is defined between the first conductive portion and the second conductive portion. A third conductive portion couples (e.g., electrically connects) the second conductive portion with the first conductive portion. The third conductive portion is provided underlying the region. Here, the term "underlying" is merely used to for descriptive purposes and has no relationship to the direction of gravity. The dual damascene structure also has a substantially planar surface region formed opposing the third conductive portion. The substantially planar surface region comprises a portion of the first conductive portion and a portion of the second conductive portion. A first capacitor electrode is formed from at least the first conductive portion, the second conductive portion, and the third conductive portion.

The device has an opening formed in a portion of the region between the first conductive portion and the second conductive portion. A capacitor insulting layer is formed within the opening in the region. A planarized copper layer is overlying the insulating layer. The planarized copper layer includes a surface region at a height at about the substantially planar surface region. A second electrode is formed from a portion of the planarized copper layer. A description of ways to fabricate the present device structure can be found throughout the present specification and more particularly below.

A method for forming a capacitor structure in a dual damascene process according to the present invention may be outlined as follows:

(1) Provide semiconductor substrate;
(2) Form barrier layer (e.g., tantalum and tantalum nitride) overlying substrate;
(3) Form copper layer overlying the barrier layer;
(4) Form barrier layer comprising silicon nitride overlying the copper layer;
(5) Form first dielectric layer (e.g., Low k, FSG) overlying the barrier layer;
(6) Form nitride or oxynitride layer overlying the first dielectric layer;
(7) Form second dielectric layer (e.g., Low k dielectric, FSG) overlying the nitride or oxynitride layer;
(8) Form cap nitride layer overlying the second dielectric layer;
(9) Form openings for damascene structure;
(10) Fill in damascene structure with copper material;
(11) Planarize surface of copper material;
(12) Mask surface overlying exposed dielectric material;
(13) Perform plasma etch process (e.g., CH2F2) to remove first portion of the exposed dielectric material;
(14) Perform selective wet etch process (e.g., HF) to selectively remove second portion of the exposed dielectric material to the barrier material;
(15) Form capacitor dielectric within opening defined by the above etching processes;
(16) Form barrier (e.g., tantalum and tantalum nitride) within the opening;
(17) Fill in opening with copper material;
(18) Planarize copper material using chemical mechanical polishing; and
(19) Perform other processes, as desirable.

The above steps provides a way of manufacture a capacitor structure according to an embodiment of the present invention. Depending upon the application, certain steps may be combined or even separated. Certain steps may be performed in other order or sequence also depending upon the embodiment. Other steps may be added or steps may be omitted depending upon the embodiment. These and other details are found throughout the present specification and more particularly below.

FIGS. 2–5 are simplified diagrams illustrating methods for forming a capacitor structure according to embodiments of the present invention. These diagrams are merely examples, which should not unduly limit the scope of the claims herein. One of ordinary skill in the art would recognize many other variations, modifications, and alternatives. Like reference numerals have been used in these figures as certain other figures for illustration purposes only. As shown, the method begins by providing a semiconductor substrate, e.g., silicon wafer. The method forms barrier layer (e.g., tantalum and tantalum nitride) overlying substrate. The method then forms copper layer 103 overlying the barrier layer. A barrier layer comprising silicon nitride is formed overlying the copper layer to enclose the copper layer The method forms first dielectric layer (e.g., Low k, FSG) overlying the barrier layer. The method then forms nitride or oxynitride layer overlying the first dielectric layer. A second dielectric layer (e.g., Low k dielectric, FSG) is overlying the nitride or oxynitride layer. A cap nitride layer is formed overlying the second dielectric layer. Openings are formed for the damascene structures 102, 106. The structures are filled using copper material. The copper material is planarized. As shown, the structures including a first portion 106 and a second portion 102, which are separated by region 203. Region 203 is formed of dielectric material 104, which is later removed.

Figure 3:
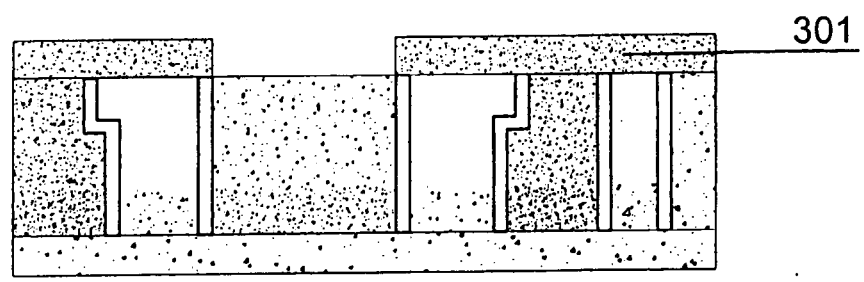
Figure 4:
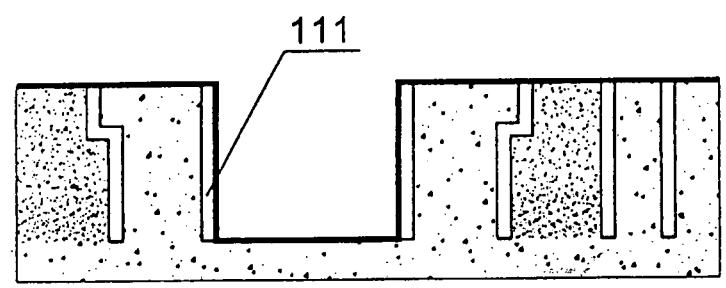
Figure 5:
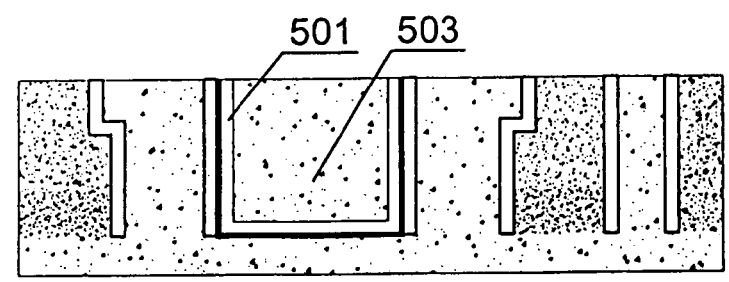

Referring to FIG. 3, the method forms a mask 301 on a surface overlying exposed dielectric material. The mask can be a photolithographic material, which is developed and patterned. The region between the two damascene structures is exposed and patterned. Here, the method performs a plasma etch process to remove first portion of the exposed dielectric material. The method then selectively etches via wet etch to selectively remove second portion of the exposed dielectric material to the barrier material, as illustrated by FIG. 4. The method then forms a capacitor dielectric 111 within opening defined by the above etching processes. The capacitor dielectric can be any suitable material, e.g., silicon nitride, oxide, any combination of these. The capacitor dielectric is provided by chemical vapor deposition. The method forms a barrier 501 (e.g., tantalum and tantalum nitride) within the opening overlying the capacitor dielectric. Referring to FIG. 5, the method fills in the opening with copper material 503. The copper material is often planted using well known techniques. Next, the copper material is planarized using chemical mechanical polishing. The remaining portion of region 503 defines a second capacitor plate. Depending upon the embodiment, there can be other steps as desired. Depending upon the application, certain steps may be combined or even separated. Certain steps may be performed in other order or sequence also depending upon the embodiment. Other steps may be added or steps may be omitted depending upon the embodiment.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of forming a metal on metal capacitor structure for an integrated circuit device, the method comprising:

forming a dual damascene structure, where the structure has a first conductive portion comprising copper material that is separated by a dielectric material from a second conductive portion, the second conductive portion is coupled to the first conductive portion underlying the dielectric material through a third conductive portion, the first conductive portion, the dielectric material, and the second conductive portion forming a substantially planar surface region opposing the third conductive portion, the first conductive portion and the second conductive portion coupled through the third conductive portion define a first electrode;

selectively removing the dielectric material between the first conductive portion and the second conductive portion to form an opening defined by the first conductive portion and the second conductive portion;

forming an insulting layer within with opening to define a capacitor dielectric layer therefrom;

forming a copper layer overlying the insulating layer to a height above the substantially planar surface to form a second electrode; and planarizing the copper layer to define the second electrode.

2. The method of claim 1 wherein the planarizing is a chemical mechanical polishing process.

3. The method of claim 1 wherein the first electrode and the second electrode comprise substantially copper material.

4. The method of claim 1 wherein the opening defined by the first portion, the second portion, and the third portion comprises a barrier material defined thereon.

5. The method of claim 1 wherein the first portion and the second portion include a height of about 1 micron and greater.

6. The method of claim 1 wherein the first portion and the second portion along the opening include a spacing of about 100 microns and greater.

7. The method of claim 1 wherein the substantially planar surface is defined by a chemical mechanical polishing process.

8. The method of claim 1 wherein the selecting etching is provided by a plasma etching process comprising a fluorine bearing species followed by a wet etching process using a HF bearing species.

9. The method of claim 1 wherein the HF bearing species has a concentration of about 5% HF or less.

10. The method of claim 8 wherein the plasma etching process has an end point upon exposing a portion of a barrier material defined on the third portion of the conductive material.

11. An integrated circuit device including capacitor structures comprising:
a semiconductor substrate;
a dual damascene structure formed overlying the semiconductor substrate, the dual damascene structure comprising:
a first conductive portion comprising copper material;
a second conductive portion comprising a copper material coupled to the first conductive portion;
a region defined between the first conductive portion and the second conductive portion;
a third conductive portion connecting the second conductive portion and the first portion, the third conductive portion being provided underlying the region;
a substantially planar surface region formed opposing the third conductive portion, the substantially planar surface region comprising a portion of the first conductive portion and a portion of the second conductive portion;
a first capacitor electrode formed from at least the first conductive portion, the second conductive portion, and the third conductive portion;
an opening formed in a portion of the region between the first conductive portion and the second conductive portion;
a capacitor insulting layer formed within the opening in the region;
a planarized copper layer overlying the insulating layer, the planarized copper layer including a surface region at a height at about the substantially planar surface region; and
a second electrode formed from a portion of the planarized copper layer.

12. The method of claim 11 wherein the planarized copper layer is provided by chemical mechanical polishing.

13. The method of claim 11 wherein the first electrode and the second electrode comprise substantially copper material.

14. The method of claim 11 wherein the opening formed by the first portion, the second portion, and the third portion comprises a barrier material defined thereon.

15. The method of claim 11 wherein the first portion and the second portion include a height of about 1 micron and greater.

16. The method of claim 11 wherein the opening within the region has a spacing of about 100 microns and greater.

17. The method of claim 11 wherein the first conductive portion comprises a first plug region and an overlying first layer region and the second conductive portion comprises a first plug region and an overlying first layer region.

* * * * *